United States Patent
Chang et al.

(10) Patent No.: US 11,699,768 B1
(45) Date of Patent: Jul. 11, 2023

(54) PATTERNED ELECTRODE STRUCTURE FOR IMAGE SENSOR

(71) Applicant: VisEra Technologies Company Ltd., Hsin-Chu (TW)

(72) Inventors: Kai-Hao Chang, Hsin-Chu (TW); Ching-Hua Li, Hsin-Chu (TW); Yu-Chi Chang, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 0 days.

(21) Appl. No.: 17/707,893

(22) Filed: Mar. 29, 2022

(51) Int. Cl.
  *H01L 27/146* (2006.01)
  *H01L 31/0224* (2006.01)
  *H04N 25/11* (2023.01)

(52) U.S. Cl.
  CPC .......... *H01L 31/022466* (2013.01); *H01L 27/14625* (2013.01); *H01L 27/14665* (2013.01); *H04N 25/11* (2023.01)

(58) Field of Classification Search
  None
  See application file for complete search history.

(56) References Cited

U.S. PATENT DOCUMENTS

| | | | |
|---|---|---|---|
| 2018/0203170 A1* | 7/2018 | Park | G02F 1/133514 |
| 2019/0157324 A1* | 5/2019 | Watanabe | H01L 27/14621 |
| 2020/0119073 A1* | 4/2020 | Machida | H01L 27/14623 |
| 2021/0091135 A1* | 3/2021 | Yokogawa | H01L 27/14645 |
| 2021/0134867 A1* | 5/2021 | Jin | H01L 27/14627 |

* cited by examiner

*Primary Examiner* — Twyler L Haskins
*Assistant Examiner* — Wesley J Chiu
(74) *Attorney, Agent, or Firm* — Liu & Liu

(57) ABSTRACT

An electrode structure including a top electrode and a bottom electrode located below the top electrode. The top electrode includes a plurality of inner electrodes and an outer electrode connected with the inner electrodes. The inner electrodes are configured to filter a light by wavelength range and filter the light into a polarized light. The inner electrodes extend along a first direction. Each of the inner electrodes includes a metal structure having a first portion and a second portion and a dielectric structure located between the first portion and the second portion of the metal structure. The first portion, the dielectric structure, and the second portion are arranged along a second direction perpendicular to the first direction.

19 Claims, 17 Drawing Sheets

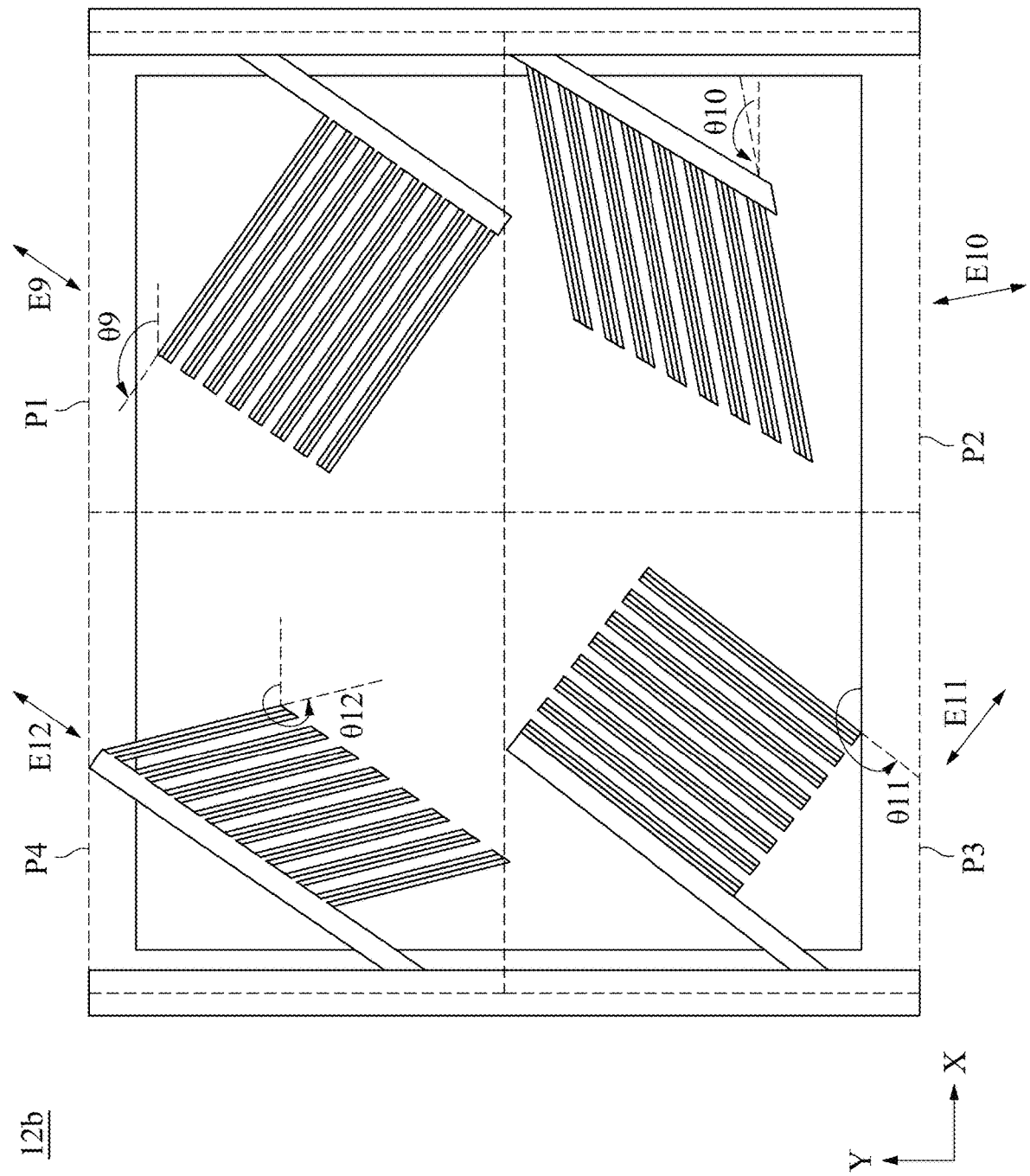

| color<br>dimensional parameter | Cyan | Magenta | Yellow |
|---|---|---|---|
| Pitch (nm) | 400 | 350 | 300 |
| Width (nm) | 240 | 280 | 180 |
| Duty cycle(%) | 60 | 80 | 60 |

Fig. 10

PATTERNED ELECTRODE STRUCTURE FOR IMAGE SENSOR

BACKGROUND

Field of Invention

The present invention relates to an image sensor, especially for a multifunctional image sensor.

Description of Related Art

An image sensor can detect and convey information used to make an image. Image sensors are used in various imaging devices such as digital cameras, optical mouse devices, medical imaging equipment, thermal imaging devices, radar, sonar, and so on.

A traditional image sensor may include a color filter, a polarization array, and an electrode structure. For example, the polarization array is below the color filter and above the electrode structure. However, the electrode structure of a conventional image sensor is separated from the color filter and the polarization array. Therefore, the manufacturing process is more complicated and package cost is higher.

SUMMARY

One aspect of the invention provides an electrode structure applied in an image sensor.

In some embodiments, the electrode structure includes a top electrode and a bottom electrode present below the top electrode. The top electrode includes a plurality of inner electrodes and an outer electrode electrically connected with the inner electrodes. The inner electrodes are configured to filter a light by wavelength range and filter the light into a polarized light. Each of the inner electrodes includes a metal structure having a first portion and a second portion extending along a first direction and a dielectric structure extending along the first direction. The dielectric structure is located between the first portion and the second portion of the metal structure. The first portion, the dielectric structure, and the second portion are arranged along a second direction perpendicular to the first direction. The top electrode and the bottom electrode are overlapped in a third direction perpendicular to the first direction and the second direction.

In some embodiments, the electrode structure further includes a photoelectric conversion layer (PCL) configured to convert the light into electric signals, and the outer electrode, the metal structure, and the dielectric structure are located above the photoelectric conversion layer.

In some embodiments, each of the inner electrodes further includes an intermediate layer located between the metal structure and the photoelectric conversion layer and configured to smoothen a potential energy difference between the metal structure and the photoelectric conversion layer.

In some embodiments, the intermediate layer includes transparent conductive oxide (TCO).

In some embodiments, the outer electrode is physically connected with the intermediate layers of the inner electrodes, and the outer electrode and the intermediate layers are located above a top surface of the photoelectric conversion layer.

In some embodiments, the outer electrode and the intermediate layers have the same material.

In some embodiments, the intermediate layers are located above a top surface of the photoelectric conversion layer facing the top electrode, and the metal structure and the dielectric structure of each of the inner electrodes are in contact with a top surface of the corresponding intermediate layer.

In some embodiments, the outer electrode is physically connected with the metal structures of the inner electrodes, and the outer electrode is space apart from a top surface of the photoelectric conversion layer facing the top electrode.

In some embodiments, each of the intermediate layers surround a lower portion of the metal structure and a lower portion of the dielectric structure, and the intermediate layer and the lower portion are embedded in the photoelectric conversion layer.

In some embodiments, a pitch of the inner electrodes is in a range of $0.5\lambda$ to $0.75\lambda$, and $\lambda$ corresponds to a peak or a valley of a light spectrum.

In some embodiments, each of the inner electrodes has a width along the second direction, and a duty cycle of the inner electrodes is in a range from 20% to 90%.

Another aspect of the invention provides an image sensor.

In some embodiments, the image sensor includes multiple pixels, a photoelectric conversion layer, and multiple intermediate layers. Each of the pixels includes multiple sub-pixels. Each of the sub-pixels includes a electrode structure. The photoelectric conversion layer is configured to convert light into electric signals, and the photoelectric conversion layer is located between the top electrode and the bottom electrode. The intermediate layers are configured to improve carrier transportation performance, and the intermediate layers are located between the corresponding metal structures and the photoelectric conversion layer. Each of the electrode structures includes a top electrode and a bottom electrode present below the top electrode. The top electrode includes a plurality of inner electrodes and an outer electrode electrically connected with the inner electrodes. The inner electrodes are configured to filter a light by wavelength range and filter the light into a polarized light. Each of the inner electrodes includes a metal structure having a first portion and a second portion extending along a first direction and a dielectric structure extending along the first direction. The dielectric structure is located between the first portion and the second portion of the metal structure. The first portion, the dielectric structure, and the second portion are arranged along a second direction perpendicular to the first direction. The top electrode and the bottom electrode are overlapped in a third direction perpendicular to the first direction and the second direction.

In some embodiments, a number of the sub-pixels is four, each of the inner electrodes in the sub-pixels has a tilted angle, and the tilted angles of the inner electrodes of adjacent two of the sub-pixels have an angle difference of 45 degrees.

In some embodiments, the sub-pixels include a first sub-pixel, a second sub-pixel, a third sub-pixel, and a fourth sub-pixel, the first sub-pixel has a first tilted angle, the second sub-pixel has a second tilted angle, the third sub-pixel has a third tilted angle, the fourth sub-pixel has a fourth tilted angle, the first tilted angle is smaller than the second tilted angle, the third tilted angle, and the fourth tilted angle, and wherein the first tilted angle is 90 degrees, 120 degrees, or 150 degrees.

In some embodiments, a number of the pixels is four, the pixels form a pixel array, and the pixel array includes a CYYM mosaic arrangement, and the pixel array includes a cyan pixel, a magenta pixel, and two yellow pixels.

In some embodiments, a number of the pixels is four, the pixels form a pixel array, and the pixel array includes a RGGB mosaic arrangement, and the pixel array includes a red pixel, a blue pixel, and two green pixel.

In some embodiments, a number of the pixels is four, the pixels form a pixel array, and the pixel array includes a CYGM mosaic arrangement, and the pixel array includes a cyan pixel, a yellow pixel, a green pixel, and a magenta pixel.

In some embodiments, a number of the pixels is four, the pixels form a pixel array, and the pixel array includes a RGBW mosaic arrangement and the pixel array includes a red pixel, a green pixel, a blue pixel, and a white pixel.

In some embodiments, the image sensor includes a n-channel device, the intermediate layers are located above a top surface of the photoelectric conversion layer facing the top electrode, and the metal structure and the dielectric structure of each of the inner electrodes are in contact with a surface of the corresponding intermediate layer facing away from the photoelectric conversion layer.

In some embodiments, the image sensor includes a p-channel device, each of the intermediate layers surround a lower portion of the metal structure and the dielectric structure, and the intermediate layer and the lower portion are embedded in the photoelectric conversion layer.

In the aforementioned embodiments, since each of the inner electrodes of the present disclosure is a hybrid structure and the pitch and width of the inner electrodes can be determined based the wavelength of a light and duty cycle, the configuration of the top electrode of the present disclosure can filter the light by wavelength range and filter the light into a polarized light. Therefore, the top electrode can perform both functions of a color filter and a polarizer. In other words, the top electrode of the present disclosure is an integrated structure of an electrode, a color filter, and a polarizer.

BRIEF DESCRIPTION OF THE DRAWINGS

The invention can be more fully understood by reading the following detailed description of the embodiment, with reference made to the accompanying drawings as follows:

FIG. 5 is a top view of a pixel of an image sensor according to another embodiment of the present disclosure;

FIG. 10 is a table of properties of inner electrodes for different color lights.

DETAILED DESCRIPTION

Figure 1:
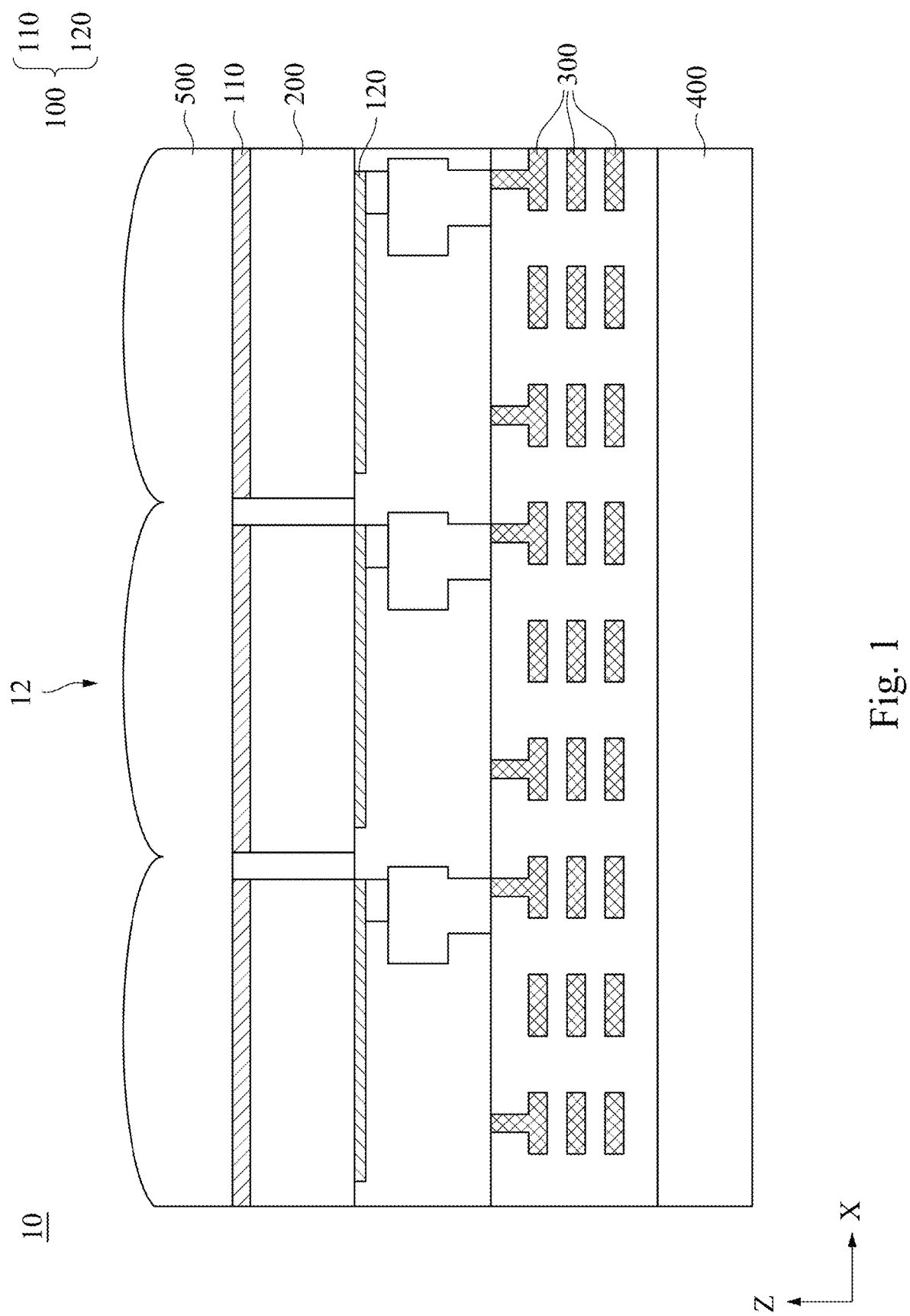
FIG. 1 is a cross-sectional view of an image sensor according to one embodiment of the present embodiment.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of an image sensor 10 according to one embodiment of the present embodiment. The image sensor 10 includes electrode structures 100 and a photoelectric conversion layer 200 (PCL). The electrode structure 100 includes a top electrode 110 and a bottom electrode 120 present below the top electrode 110. The photoelectric conversion layer 200 is present between the top electrode 110 and the bottom electrode 120. The top electrode 110 and the bottom electrode 120 are overlapped in a third direction Z. The photoelectric conversion layer 200 is configured to convert light into electrical signals. For example, the photoelectric conversion layer 200 can be formed by organic polymer or perovskite. The light transmitted through the top electrode 110 can be converted to electrical signals by the photoelectric conversion layer 200.

The image sensor 10 is a Complementary Metal-Oxide-Semiconductor (CMOS) image sensor. The image sensor 10 further includes metal interconnections 300, a substrate 400, and a lens array 500. The substrate 400 includes transistors and capacitors (not shown). Transistors include n-type MOSFET and p-type MOSFET.

Figure 2A:
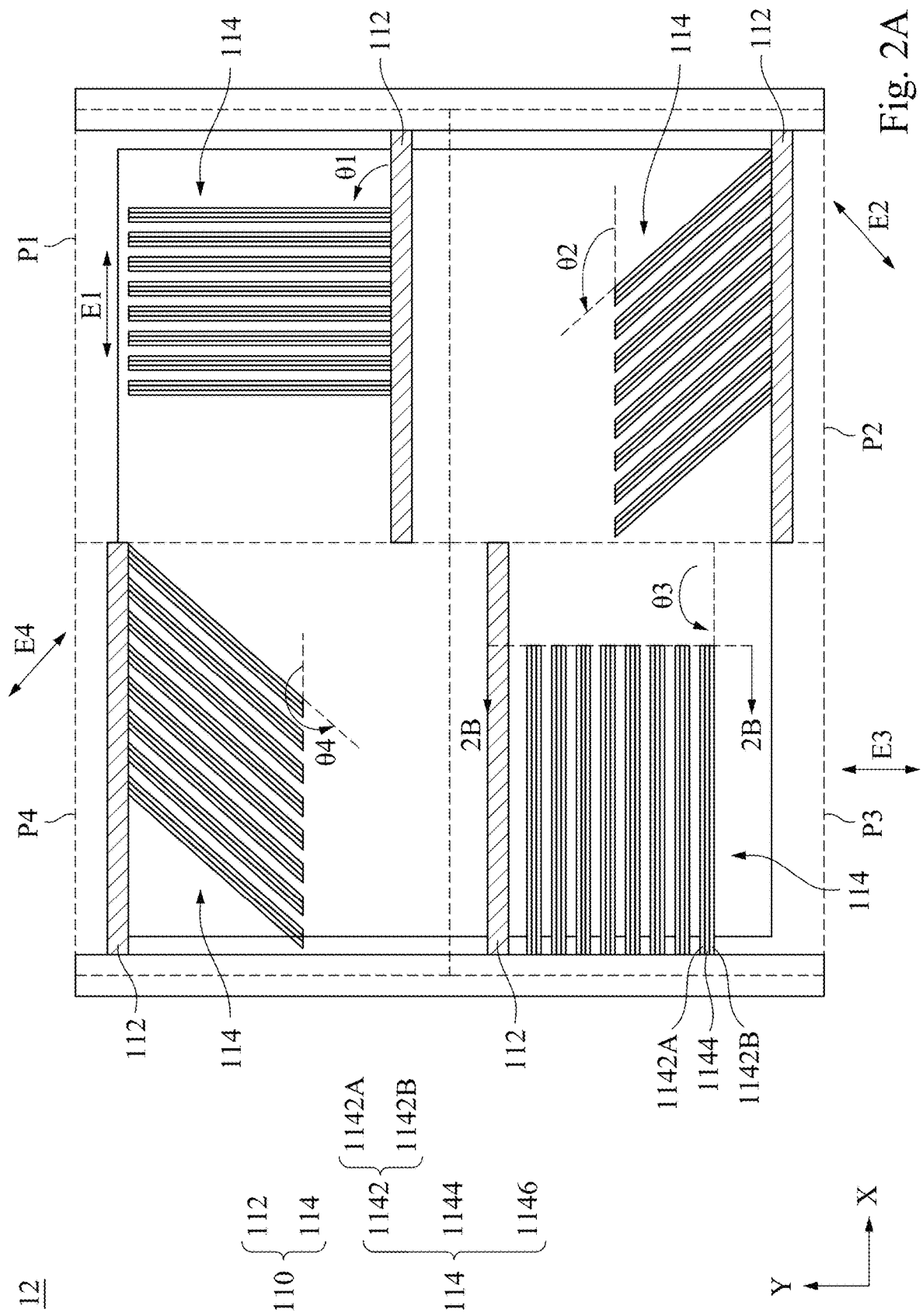
FIG. 2A is a top view of the top electrode in an image sensor according to one embodiment of the present disclosure.

FIG. 2A is a top view of atop electrode 110 of the image sensor 10 in FIG. 1. Reference is made to FIG. 1 and FIG. 2A. In the present embodiment, the pixel 12 includes four sub-pixels (e.g., first sub-pixel P1, second sub-pixel P2, third sub-pixel P3, and fourth sub-pixel P4) arranged in 2×2 order, but the present disclosure is not limited in this regard. The top electrode 110 of the electrode structures 100 has patterns corresponding to the first sub-pixel P1, second sub-pixel P2, third sub-pixel P3, and fourth sub-pixel P4, respectively.

As shown in FIG. 2A, within each sub-pixels (P1-P4), the top electrode 110 includes an outer electrode 112 and multiple inner electrodes 114 connected with the outer electrode 112. The outer electrode 112 and the inner electrodes 114 are located above the photoelectric conversion layer. The inner electrodes 114 in each of the sub-pixels (P1-P4) extend along a direction that is different form another direction in which the inner electrodes 114 are arranged. For example, as shown in the third sub-pixel P3, the inner electrodes 114 extend along a first direction X, and the inner electrodes 114 are arranged in a second direction Y perpendicular to the first direction X. In other words, the inner electrodes 114 form a grating structure.

Each of the inner electrodes 114 includes a metal structure 1142 and a dielectric structure 1144. The metal structure 1142 includes a first portion 1142A and a second portion 1142B. The dielectric structure 1144 is located between the first portion 1142A and the second portion 1142B of the metal structure 1142. The first portion 1142A, the second portion 1142B, and the dielectric structure 1144 have strip shape. The first portion 1142A, the dielectric structure 1144, and the second portion 1142B are stacked along the second direction Y. In other words, each of the inner electrodes 114 is a hybrid structure.

Figure 2B:
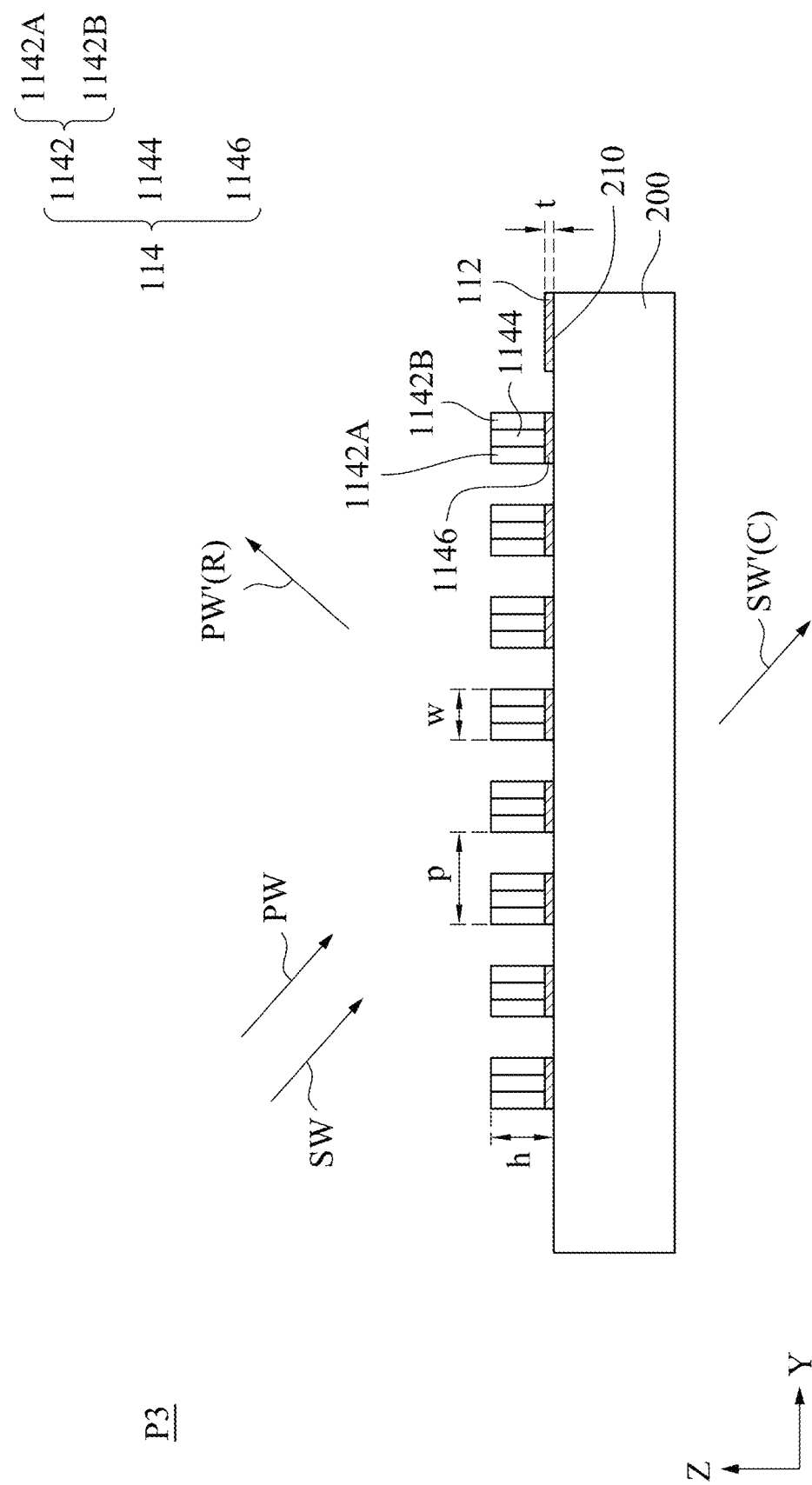
FIG. 2B is a cross-sectional view taken along line 2B-2B in FIG. 2A.
Figure 2C:
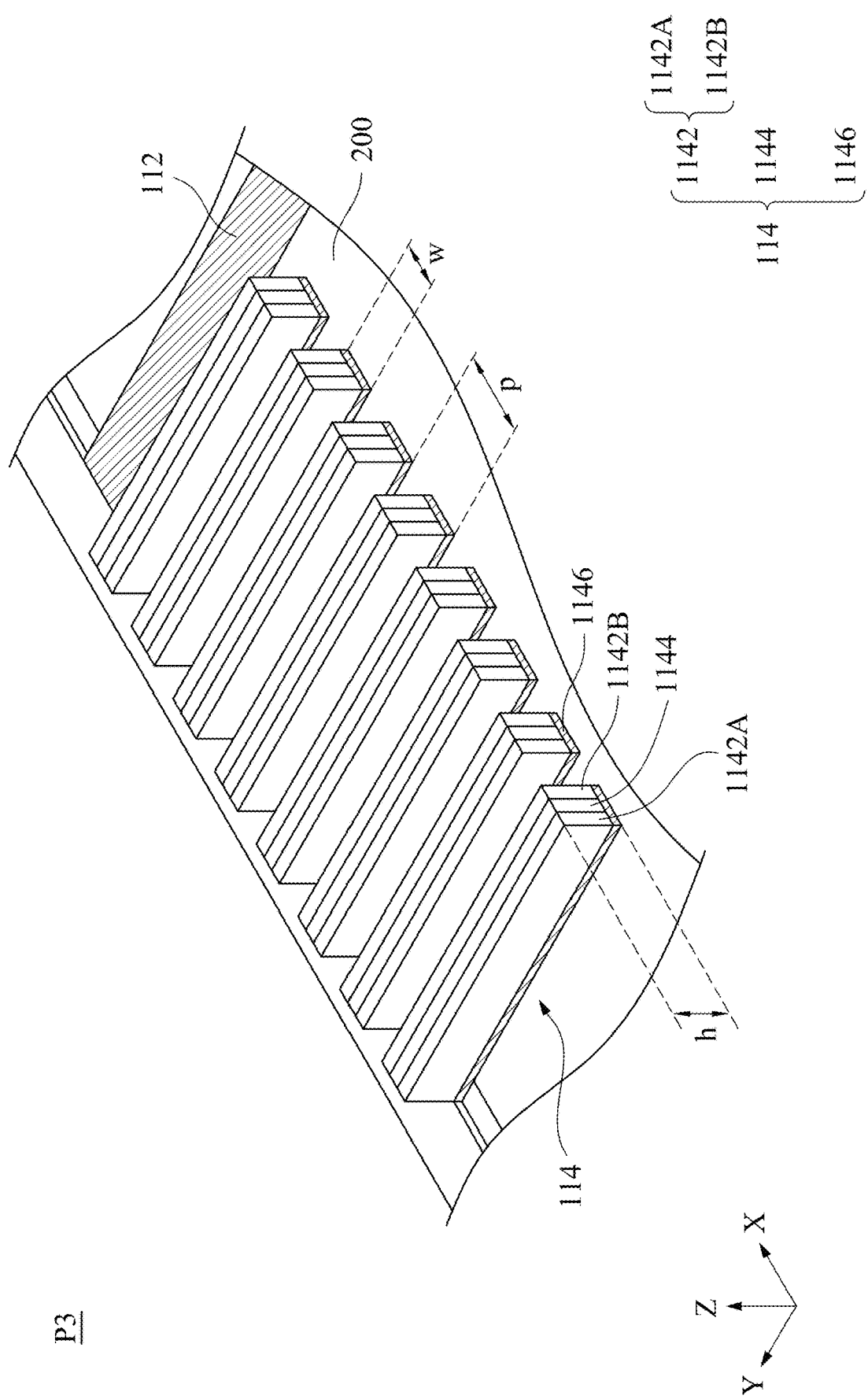
FIG. 2C is a three-dimensional view of the image sensor in FIG. 2A.

FIG. 2B is a cross-sectional view taken along line 2B-2B in FIG. 2A. FIG. 2C is a three-dimensional view of the third sub-pixel P3 of the image sensor 10 in FIG. 2A. Reference is made to FIG. 2B and FIG. 2C. Each of the inner electrodes 114 further includes an intermediate layer 1146 located between the metal structure 1142 and the photoelectric conversion layer 200 and between the dielectric structure 1144 and the photoelectric conversion layer 200. The intermediate layers 1146 extend along the first direction X. The photoelectric conversion layer 200, the intermediate layers 1146, and the hybrid structure (formed by the metal structure 1142 and the dielectric structure 1144) are stacked along the third direction Z. The third direction Z is the longitudinal direction herein.

The intermediate layer 1146 includes transparent conductive oxide (TCO). For example, the transparent conductive oxide may include Indium Tin Oxide (ITO), Zinc oxide (ZnO), Aluminum Doped Zinc Oxide (AZO), amorphous indium-gallium-zinc oxide (α-IGZO), or amorphous ZSO (α-ZSO).

As shown in FIG. 2A, the inner electrodes 114 within the first sub-pixel P1, the second sub-pixel P2, the third sub-pixel P3, and the fourth sub-pixel P4 have a first tilted angle θ1, a second tilted angle θ2, a third tilted angle θ3, and a fourth tilted angle θ4, respectively. The tilted angles herein (θ1~θ4) are defined as angles measured relative to the first direction X counterclockwise. The tilted angles (θ1~θ4) of the inner electrodes 114 within adjacent two sub-pixels (P1~P4) have an angle difference of 45 degrees. The first tilted angle θ1 of the first sub-pixel P1 is smaller than the other tilted angles (i.e., second tilted angles 82 to fourth tilted angle θ4) of the other sub-pixels (i.e., the second sub-pixel P2 to fourth sub-pixel P4). In the present embodiment, the tilted angles (θ1~θ4) of the inner electrodes 114 within the sub-pixels (P1~P4) are 90 degrees, 135 degrees, 180 degrees, and 215 degrees, respectively. The polarization angles E1~E4 of the sub-pixels (P1~P4) are 0 degrees, 45 degrees, 90 degrees, and 135 degrees, respectively. Specifically, the polarization angles herein demonstrated the polarized state of a light travel through the top electrode 110. In other words, the pattern of the top electrode 110 is a four-directional polarization array. Therefore, the inner electrodes 114 can filter a light into a polarized light. With such configuration, the image sensor 10 can have a higher extinction ratio. As such, reflection light can be removed efficiently and the image quality can be improved. Accordingly, the top electrode 110 can be utilized as a polarizer through the aforementioned pattern of the inner electrodes 114.

As shown in FIG. 2B, dimensional parameters of the inner electrodes 114 include a pitch p, a width w, and a height h. The pitch p is a distance between adjacent two inner electrodes 114. The width w of each of the inner electrodes 114 is measured along the second direction Y. The inner electrodes 114 form a periodic pattern, and therefore a duty cycle of the inner electrodes 114 is defined by w/p. In some embodiments, the duty cycle of the inner electrodes 114 is in a range from 20% to 90%. In some preferred embodiments, a duty cycle of the inner electrodes is in a range from 50% to 90%. In the present embodiment, the height h of the inner electrodes 114 is smaller than 500 um so as to avoid reduction in the light transmittance, but the present disclosure is not limited in this regard.

The pitch p of the inner electrodes 114 is defined in a range of 0.5λ to 0.75λ, and λ corresponds to a peak or a valley of a light spectrum. For example, if the pixel 12 is designed to be a cyan color filter, the value of λ can be determined by the wavelength valley of the cyan light spectrum. Since the cyan light can be considered as a mixture of blue light and green light, the wavelength valley is about 630 nm (i.e., wavelength peak of the complementary color of cyan). Under these conditions, the pitch p is in a range of 315 nm to 472 nm, and the width w can be determined by choosing a suitable duty cycle.

As illustrated in FIG. 2B, when a S-wave (s-polarized light) travel towards the inner electrodes 114, the S-wave SW becomes a cyan color S-wave SW(C) after transmitting through top electrode 110, and a P-wave PW (p-polarized light) becomes a red color P-wave PW(R) after being reflected by the top electrode 110. That is, by defining the pitch p and width w of the inner electrodes based on the wavelength of a light and duty cycle, the top electrode 110 can filter a light by wavelength range. Therefore, the top electrode 110 can be utilized as a color filter through the aforementioned dimensional parameters of the inner electrodes 114.

Accordingly, by using the inner electrodes 114 designed as hybrid structures and by defining the pitch p and width w of the inner electrodes 114 based the wavelength of a light and duty cycle, the top electrode 110 of the present disclosure can perform functions of both a color filter and a polarizer. In other words, the top electrode 110 is an integrated structure of an electrode, a color filter, and a polarizer, and the image sensor 10 is a multifunctional image sensor. Therefore, there is no need to form extra color filter layer and polarizer layer stacked above the electrodes.

Reference is made to FIG. 2B and FIG. 2C. In the present embodiment, the configuration of the electrode structures 100 is employed in an n-channel device. The outer electrode 112 is physically and electrically connected with the intermediate layer 1146 of the inner electrodes 114. The outer electrode 112 and the intermediate layers 1146 have the same material. In other words, the outer electrode 112 includes transparent conductive oxide. The outer electrode 112 and the intermediate layers 1146 are located above a top surface 210 of the photoelectric conversion layer 200. That is, the intermediate layers 1146 are located above the top surface 210 of the photoelectric conversion layer 200 facing the top electrode 110. The metal structure 1142 and the dielectric structure 1144 of each of the inner electrodes 114 are in contact with a top surface of the corresponding intermediate layer 1146. In some embodiments, a thickness t of the outer electrode 112 is smaller than 100 nm, but the present disclosure is not limited in this regard.

Regarding an n-channel, the work function energy of the intermediate layer 1146 (e.g., transparent conductive oxide) can be selected to be in a range between the work function energy of metal structure 1142 and the photoelectric conversion layer 200 (e.g., organic material). The metal structure 1142 may include metal such as aluminum (Al), copper (Cu), Tungsten, or an alloy. As such, potential energy difference between the metal structure and the photoelectric conversion layer can be smoothed by forming the intermediate layer 1146 therebetween. Therefore, carrier conduction (electrons in n-channel device) can be more efficient due to smoother potential energy reduction from the metal structure 1142 to the photoelectric conversion layer 200, and carrier transportation performance can be improved by depositing the intermediate layer 1146 including transparent conductive oxide between the hybrid structure and the photoelectric conversion layer 200.

Figure 3A:
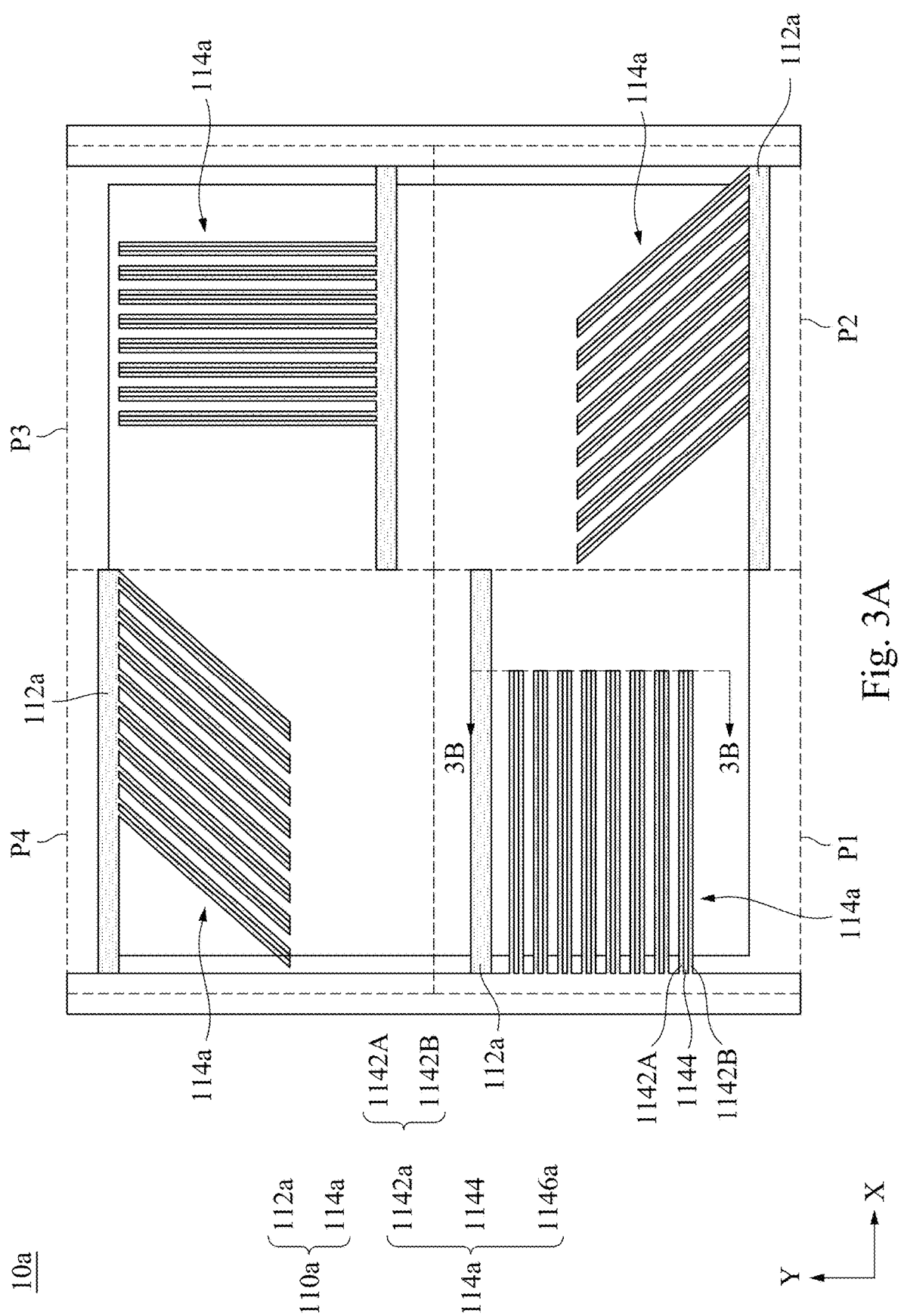
FIG. 3A is a top view of a top electrode according to another embodiment of the present disclosure.

FIG. 3A is a top view of an image sensor 10a according to another embodiment of the present disclosure. The image sensor 10a is similar to the image sensor 10 shown in FIG. 2A. The difference is that the outer electrode 112a of the top electrode 110a is connected with the metal structure 1142 of the inner electrodes 114a. The outer electrode 112a and the metal structures 1142 have the same material.

Figure 3B:
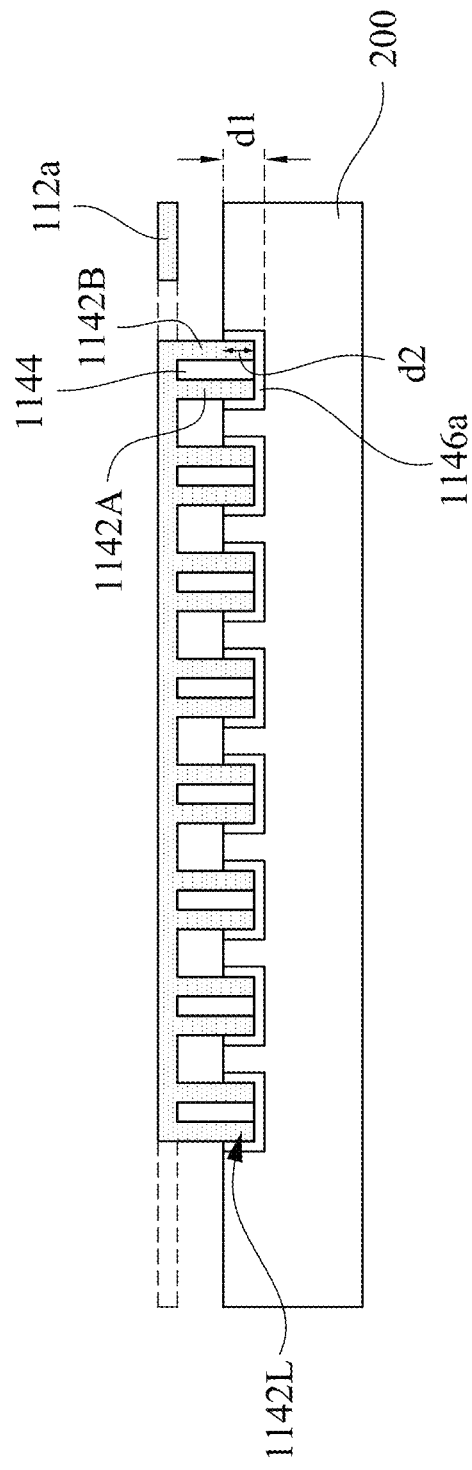
FIG. 3B is a cross-sectional view taken along line 3B-3B in FIG. 3A.
Figure 3C:
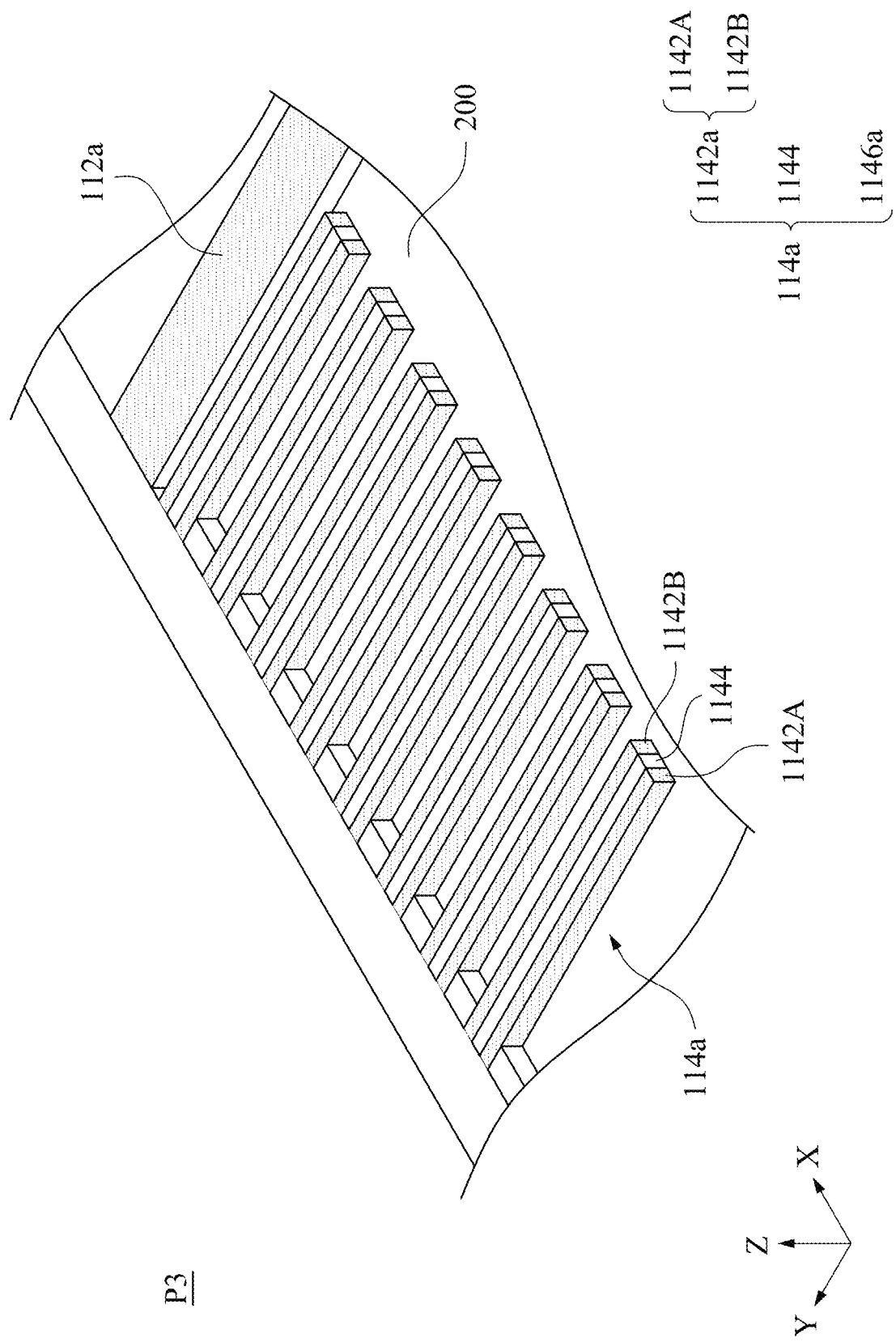
FIG. 3C is a three-dimensional view of the image sensor in FIG. 3A.

FIG. 3B is a cross-sectional view taken along line 3B-3B in FIG. 3A. FIG. 3C is a three-dimensional view of the image sensor 10a in FIG. 3A. Reference is made to FIG. 3B and FIG. 3C. Each of the intermediate layers 1146a of the inner electrode 114a surround a lower portion 1142L of the metal structure 1142a and the dielectric structure 1144, and the intermediate layer 1146a and this lower portion 1142L of the metal structure 1142a and the dielectric structure 1144 are embedded in the photoelectric conversion layer 200. In the present embodiment, the depth d1 of the intermediate layer 1146a embedded in the photoelectric conversion layer 200 is substantially the same as the depth d2 of the portion of the metal structure 1142 embedded in the photoelectric conversion layer 200, but the present disclosure is not limited in this regard. In other embodiments, the depth d1 may be smaller than the depth d2.

The configuration of the electrode structures 100a is employed in a p-channel device. Regarding a p-channel device, the carrier conduction (holes in p-channel device) can be more efficient due to smoother potential energy increasing from the metal structure 1142 to the photoelectric conversion layer 200. Accordingly, carrier transportation performance can be improved by depositing the intermediate layer 1146a between the hybrid structure and the photoelectric conversion layer 200.

Figure 4:
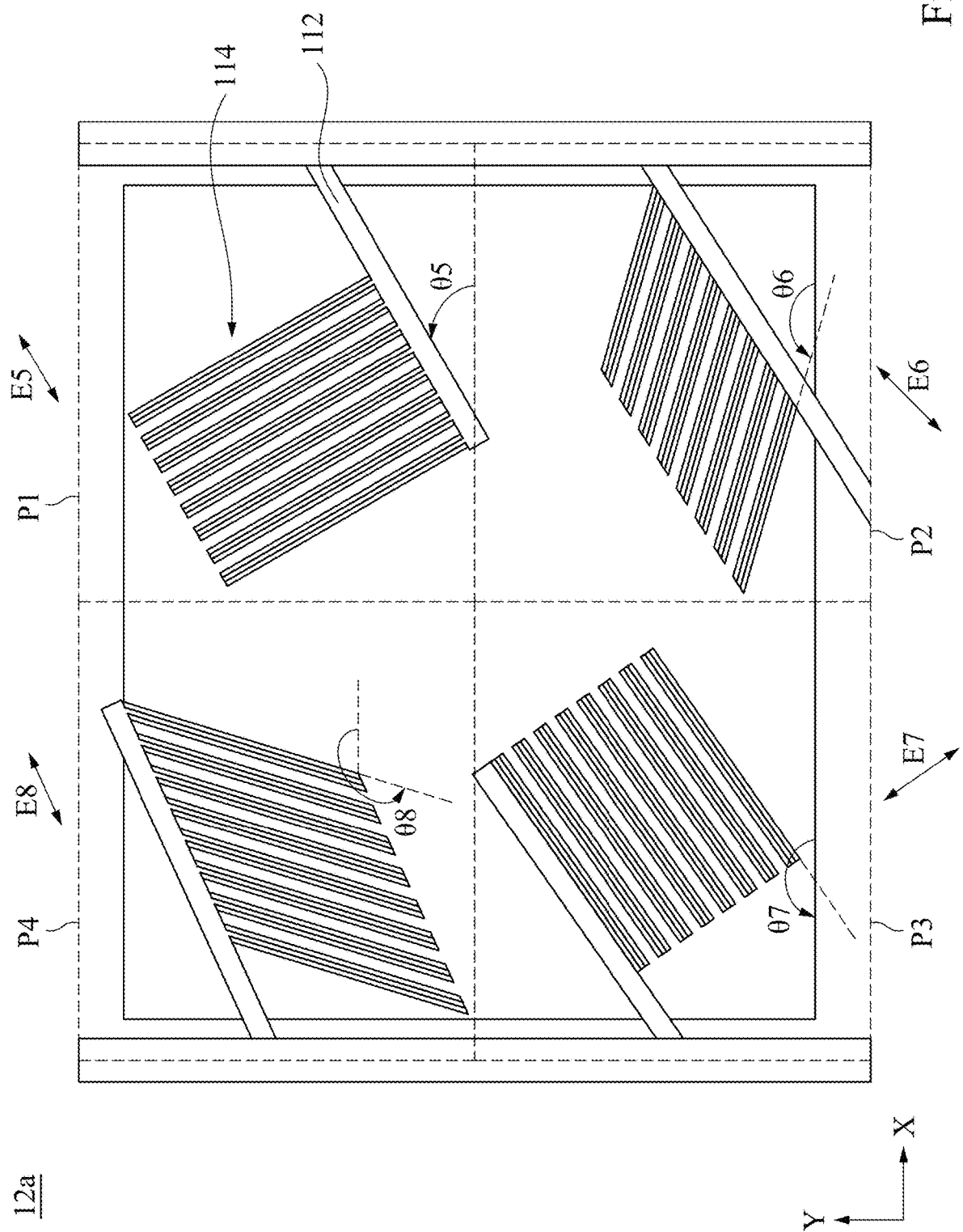
FIG. 4 is a top view of a pixel of an image sensor according to another embodiment of the present disclosure.

FIG. 4 is a top view of a pixel 12a of an image sensor according to another embodiment of the present disclosure. In the present embodiment, the tilted angles θ5~θ8 of the inner electrodes 114 within the sub-pixels (P1~P4) are 120 degrees, 165 degrees, 210 degrees, and 255 degrees, respectively. The tilted angles θ5-θ8 are defined as angles measured relative to the first direction X counterclockwise herein. The polarization angles E5~E8 of the sub-pixels (P1~P4) are 30 degrees, 75 degrees, 120 degrees, and 165 degrees, respectively. The configuration of the pixel 12a has the similar advantages of those of the pixel 12, and therefore the description is not repeated hereinafter.

FIG. 5 is a top view of a pixel 12b of an image sensor according to another embodiment of the present disclosure. In the present embodiment, the tilted angles (θ9~θ12) of the inner electrodes within the sub-pixels (P1-P4) are 150 degrees, 195 degrees, 240 degrees, and 285 degrees, respectively. The tilted angles (θ9~θ12) are defined as angles measured relative to the first direction X counterclockwise herein. The polarization angles E9~E12 of the sub-pixels (P1-P4) are 60 degrees, 105 degrees, 150 degrees, and 195 degrees, respectively. The configuration of the pixel 12b has the similar advantages of those of the pixel 12, and therefore the description is not repeated hereinafter.

It is noted that the specific value of the tilted angles (θ1~θ12) shown in FIG. 2A, FIG. 4, and FIG. 5 can be adjusted as long as the tilted angles of the inner electrodes within adjacent two sub-pixels have an angle difference of 45 degrees. Alternatively speaking, the tilted angles of the inner electrodes within two sub-pixels arranged along a diagonal direction have and angle difference of 90 degrees.

Figure 6A:
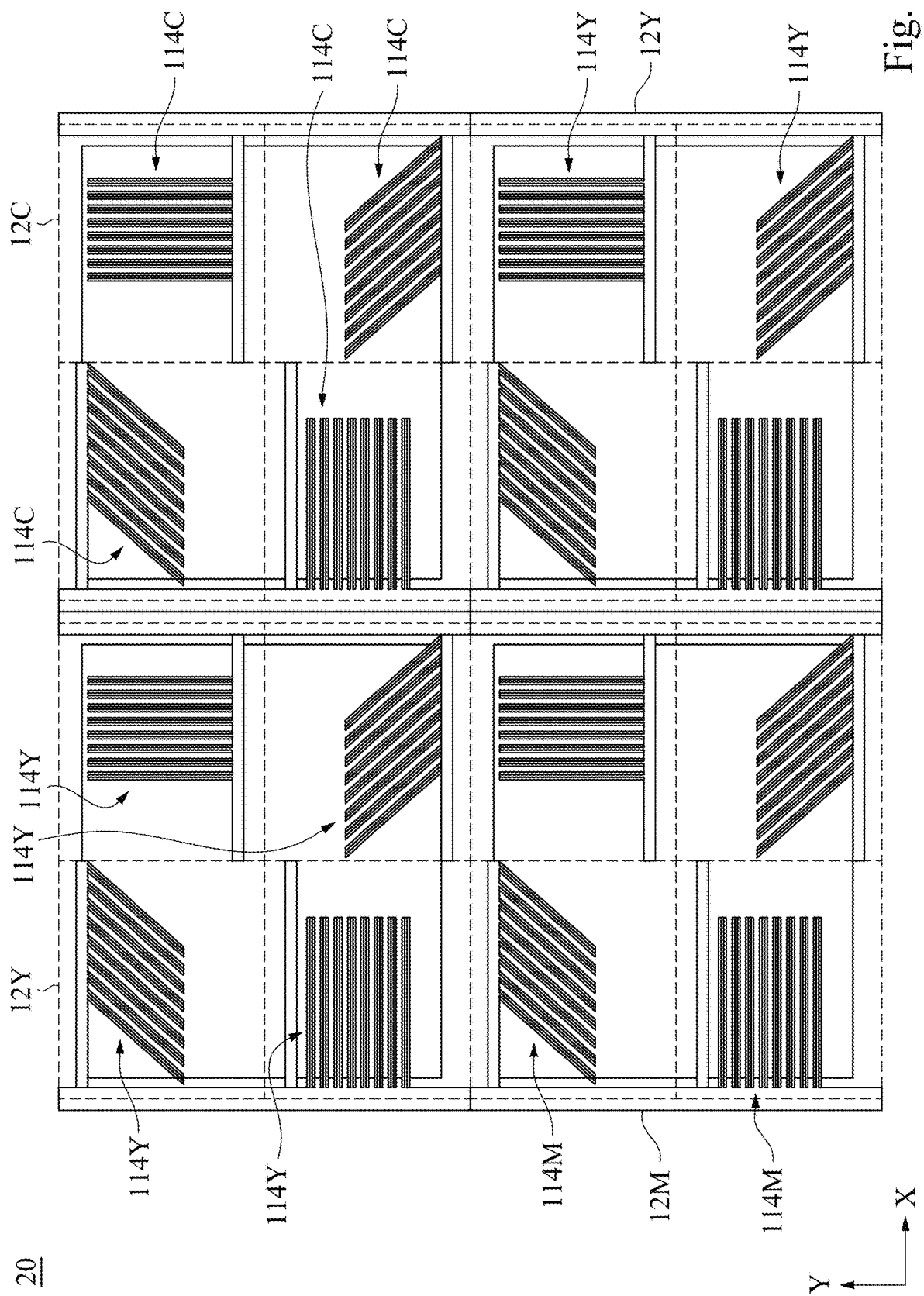
FIG. 6A is a top view of a pixel array of an image sensor according to one embodiment of the present disclosure.

FIG. 6A is a top view of a pixel array 20 of an image sensor according to one embodiment of the present disclosure. The pixel array 20 has a mosaic pattern arrangement. In the present embodiment, mosaic pattern is CYYM mosaic arrangement. One cyan pixel 12C (a group of cyan sub-pixels), one magenta pixel 12M (a group of magenta sub-pixels), and two yellow pixels 12Y (two groups of yellow sub-pixels) constitute the CYYM arrangement. Each of the pixels herein has a similar configuration as the pixel 12 shown in FIG. 2A. The inner electrodes 114C within the cyan pixel 12C are designed in a manner that the light transmitted through the inner electrodes 114C has cyan color. The inner electrodes 114M within the magenta pixel 12M are designed in a manner that the light transmitted through the inner electrodes 114M has magenta color. The inner electrodes 114Y within the yellow pixels 12Y are designed in a manner that the light transmitted through the inner electrodes 114Y has yellow color. A combination of the pixels 12, 12a, 12b shown in FIG. 2A, FIG. 4, and FIG. 5 can also be utilized herein.

It is noted that the CYYM mosaic arrangement herein is merely an exemplary embodiment. In other embodiments, the mosaic pattern can be constituted by pixels corresponding to different colors such as red, green, blue, and white. Inner electrodes of each of the pixels can be designed following the same dimensional parameters based on the wavelength of the lights (red, green, blue, and white).

Figure 6B:
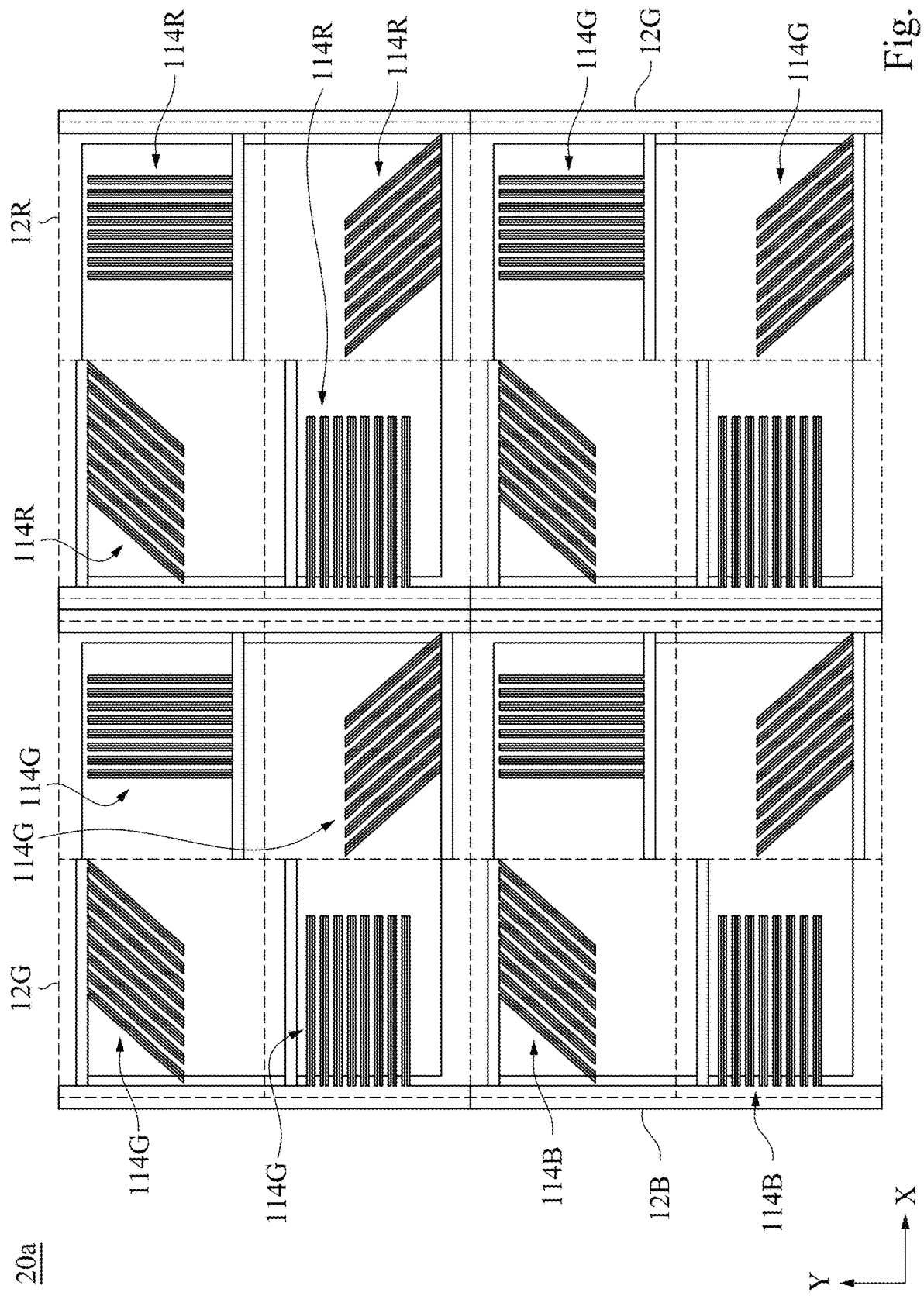
FIG. 6B is a top view of a pixel array of an image sensor according to another embodiment of the present disclosure.

FIG. 6B is a top view of a pixel array 20a of an image sensor according to another embodiment of the present disclosure. In this embodiment, the mosaic pattern of the image sensor is a RGGB mosaic arrangement. A red pixel 12R (a group of red sub-pixels), a blue pixel 12B (a group of blue sub-pixels), and two green pixels 12G (two groups of green sub-pixels) constitute the RGGB arrangement.

Figure 6C:
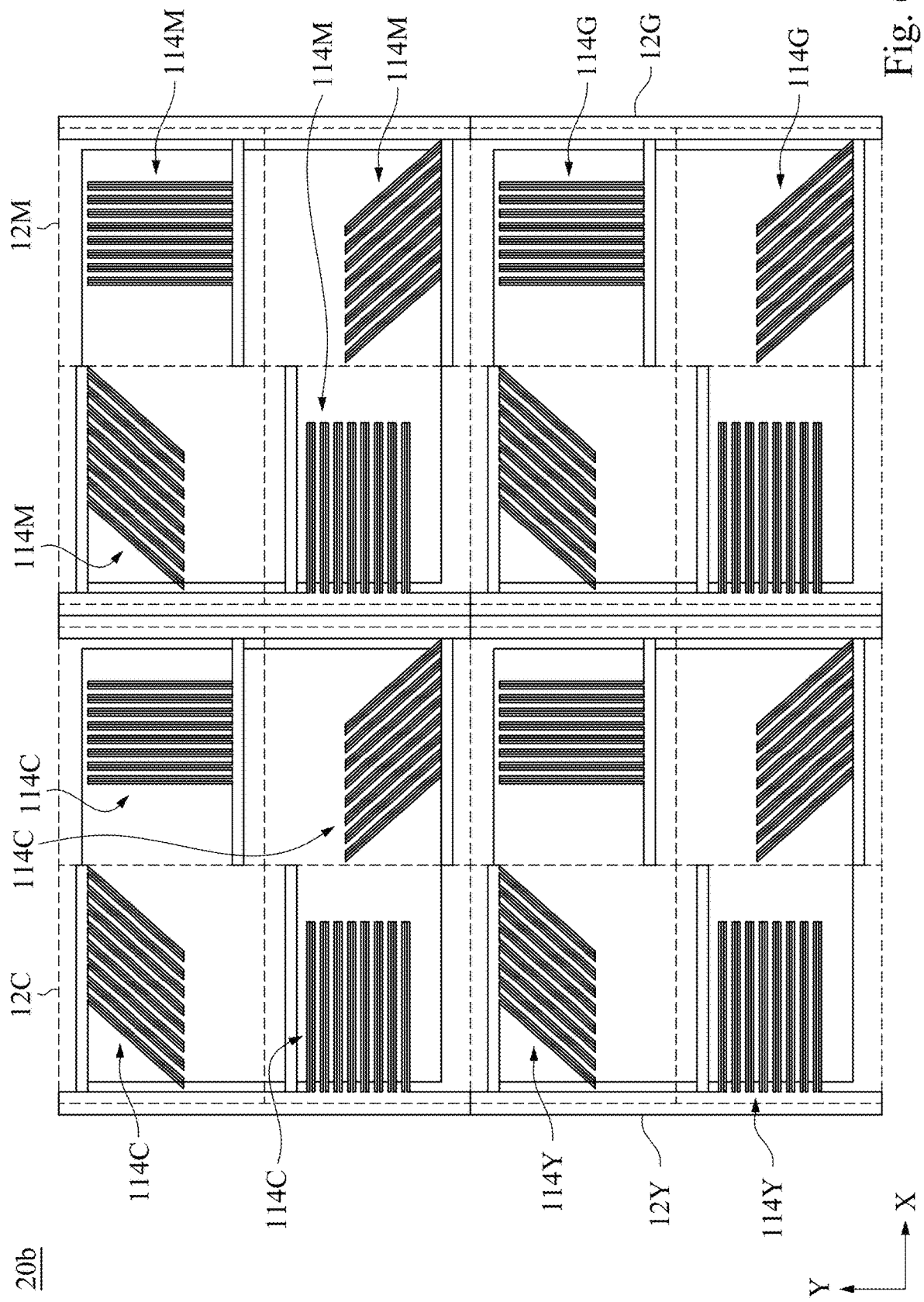
FIG. 6C is a top view of a pixel array of an image sensor according to another embodiment of the present disclosure.

FIG. 6C is a top view of a pixel array 20b of an image sensor according to another embodiment of the present disclosure. In this embodiment, the mosaic pattern of the image sensor is a CYGM mosaic arrangement. A cyan pixel 12C (a group of cyan sub-pixels), a yellow pixel 12Y (a group of yellow sub-pixels), a green pixel 12G (a group of green sub-pixels), and a magenta pixel 12M (a group of magenta sub-pixels) constitute the CYGM arrangement.

Figure 6D:
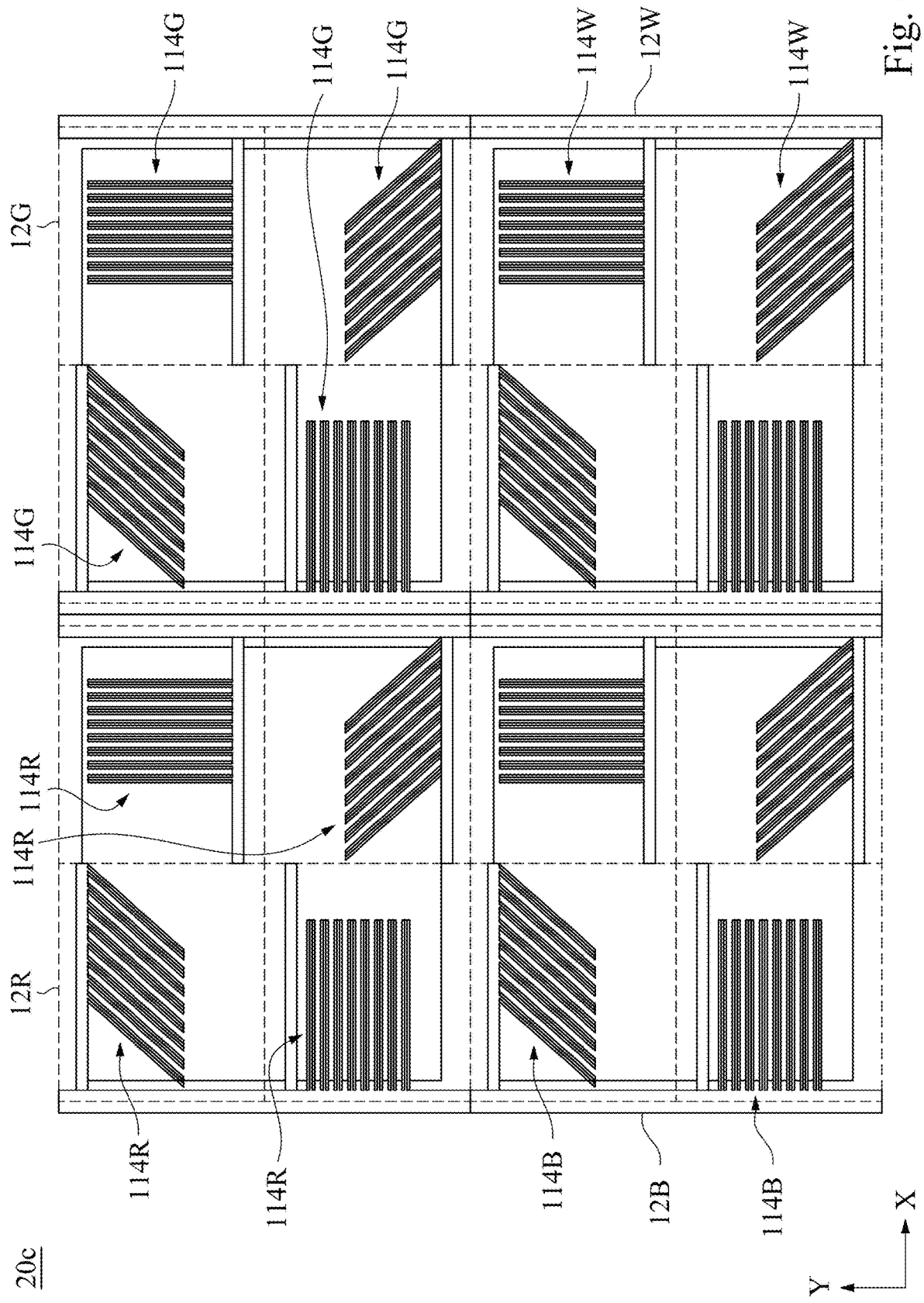
FIG. 6D is a top view of a pixel array of an image sensor according to another embodiment of the present disclosure.

FIG. 6D is a top view of a pixel array 20c of an image sensor according to another embodiment of the present disclosure. In this embodiment, the mosaic pattern of the image sensor is a RGBW mosaic arrangement. A red pixel 12R (a group of red sub-pixels), a green pixel 12G (a group of green sub-pixels), a blue pixel 12B (a group of blue sub-pixels), and a white pixel 12 W (a group of white sub-pixels) constitute the RGBW arrangement.

Figures 7A, 7B:
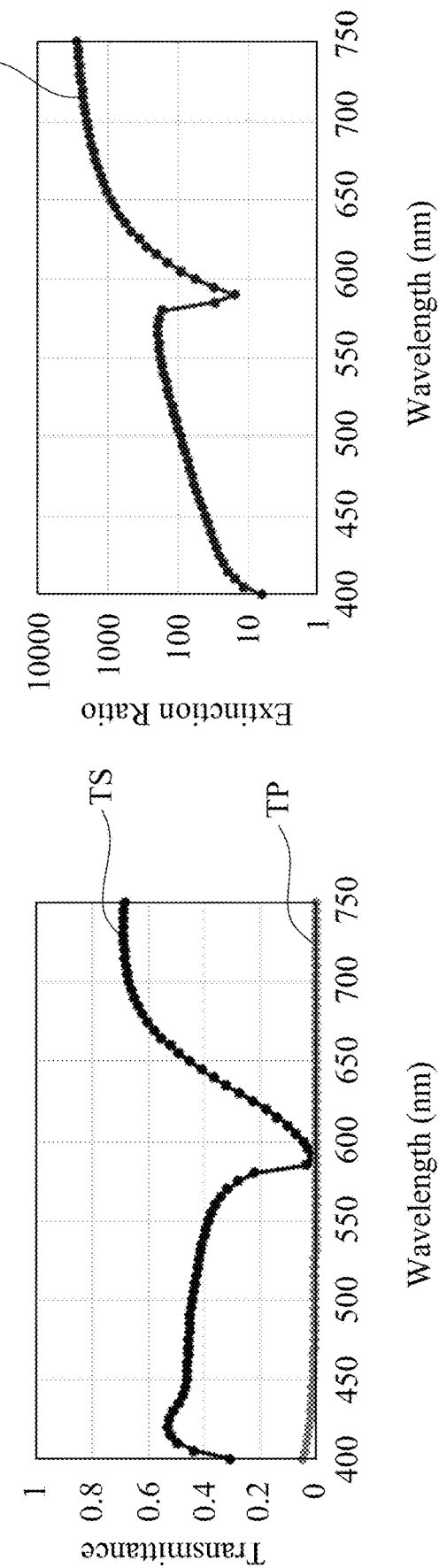
FIG. 7A, FIG. 8A, and FIG. 9A are plots of transmittance versus wavelength simulation results of a light transmitted through different electrode structures according to various embodiments of the present disclosure.
FIG. 7B, FIG. 8B, and FIG. 9B are plots of extinction ratios derived from the simulation results in FIG. 7A, FIG. 8A, and FIG. 9A, respectively.
Figure 8B:
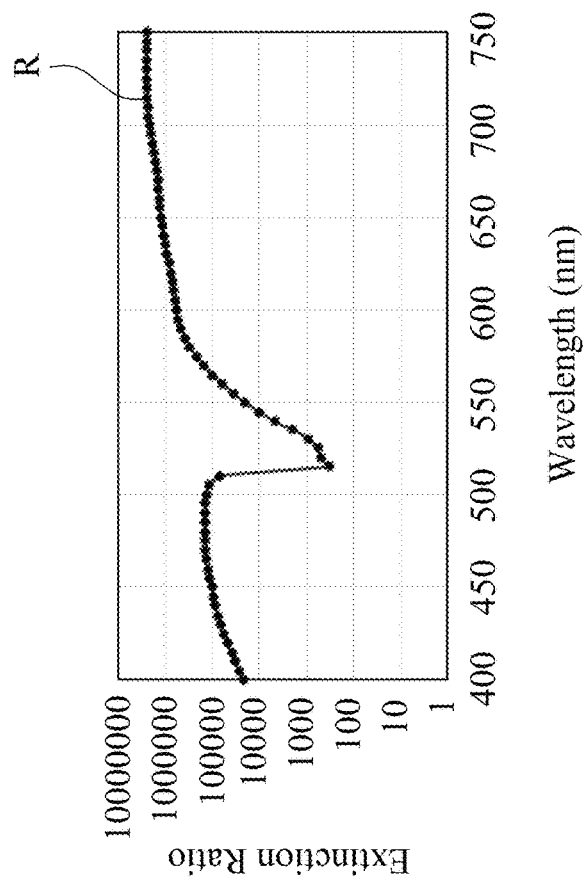
Figure 8A:
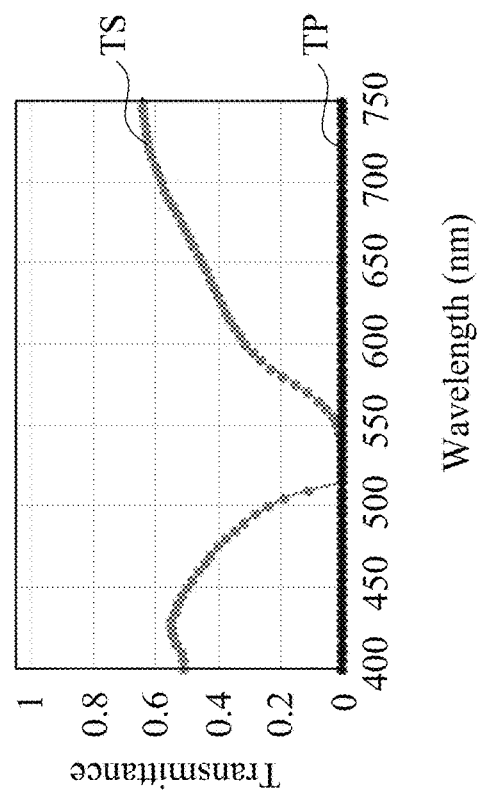
Figures 9A, 9B:
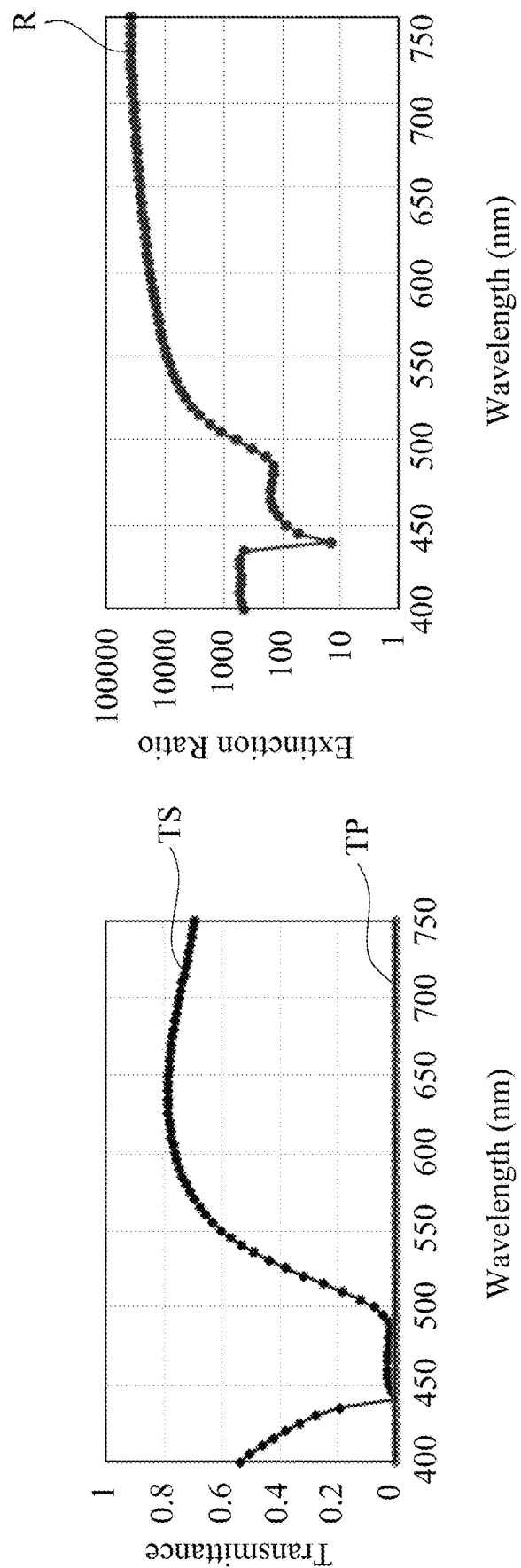

Differences between the inner electrodes 114C, 114M, 114Y will be described in the following paragraphs corresponding to FIG. 7A to FIG. 10. FIG. 7A, FIG. 8A, and FIG. 9A are plots of transmittance versus wavelength simulation results of a light transmitted through different electrode structures according to various embodiments of the present disclosure. FIG. 7B, FIG. 8B, and FIG. 9B are plots of extinction ratios derived from the simulation results in FIG. 7A, FIG. 8A, and FIG. 9A, respectively. FIG. 10 is a table of dimensional properties of the inner electrodes for different color lights used for the simulation. The material of metal structure used for the simulation can be Aluminum, Copper, and Tungsten. The material of dielectric layer can be Silicon oxide (SiO2), Aluminum oxide (Al2O3), MgF2 (Magnesium fluoride), or polymer.

FIG. 7A demonstrated the transmittance of an S-wave TS and the transmittance of a P-wave TP transmitted through the cyan pixel 12C shown in FIG. 6A. As shown in FIG. 10, the pitch p and width w of the inner electrodes 114C are 400 nm and 240 nm, respectively. That is, the duty cycle of the inner electrodes 114C is about 60%. As described above, the pitch p is in a range of $0.5\lambda$ to $0.75\lambda$, and $\lambda$ corresponds to the valley of a cyan light spectrum herein. For example, the valley of the cyan light spectrum is about 630 nm (i.e. complementary color of cyan). Therefore, the pitch p of the inner electrodes 114C is in a range of 315 nm to 472 nm.

Under those conditions, the transmittance of the S-wave TS that transmitted through the inner electrodes 114C within the cyan pixel 12C shows cyan color. On the contrary, the transmittance of the P-wave TP is much smaller than the transmittance of the S-wave SP, and the transmittance of the S-wave TS is greater than the transmittance of the S-wave TP through the whole visible light spectrum. Therefore, as shown in FIG. 7B, the extinction ratio R (TS/TP) indicates that the light transmitted through the inner electrodes 114C is dominantly a cyan color S-wave.

FIG. 8A demonstrated the transmittance of the S-wave TS and the transmittance of the P-wave TP transmitted through the magenta pixel 12M shown in FIG. 6A. As shown in FIG. 10, the pitch p and width w of the inner electrodes 114M are 350 nm and 280 nm, respectively. That is, the duty cycle of the inner electrodes 114M is about 80%. Similarly, the valley of the magenta light spectrum (blue light and red light) is about 575 nm (i.e. complementary color of magenta). Therefore, the pitch p of the inner electrodes 114M is in a range of 287 nm to 430 nm.

Under those conditions, the S-wave TS that transmitted through the inner electrodes 114M shows magenta color. On the contrary, the transmittance of the P-wave TP is much smaller than the transmittance of the S-wave SP, and the transmittance of the S-wave TS is greater than the transmittance of the P-wave TP through the whole visible light spectrum. Therefore, as shown in FIG. 8B, the extinction ratio R (TS/TP) indicates that the light transmitted through the inner electrodes 114M is dominantly a magenta color S-wave.

FIG. 9A demonstrated the transmittance of the S-wave TS and the transmittance of the P-wave TP transmitted through the inner electrodes 114Y shown in FIG. 6A. As shown in FIG. 10, the pitch p and width w of the inner electrodes 114Y are 300 nm and 180 nm, respectively. That is, the duty cycle of the inner electrodes 114Y is about 60%. Similarly, the valley of the yellow light spectrum (green light and red light) is about 440 nm (i.e. complementary color of magenta). Therefore, the pitch p of the inner electrodes 114Y is in a range of 220 nm to 330 nm.

Under those conditions, the S-wave TS that transmitted through the inner electrodes 114Y shows yellow color. On the contrary, the transmittance of the P-wave TP is much smaller than the transmittance of the S-wave SP, and the transmittance of the S-wave TS is greater than the transmittance of the P-wave TP through the whole visible light spectrum. Therefore, as shown in FIG. 9B, the extinction ratio R (TS/TP) indicates that the light transmitted through the inner electrodes 114Y is dominantly a yellow color S-wave.

In summary, since each of the inner electrodes of the present disclosure is a hybrid structure, and the pitch and width of the inner electrodes can be determined based the wavelength of a light and duty cycle, the configuration of the top electrode of the present disclosure can filter the light by wavelength range and filter the light into a polarized light. Therefore, the top electrode can perform both functions of a color filter and a polarizer. In other words, the top electrode of the present disclosure is an integrated structure of an electrode, a color filter, and a polarizer, and the image sensor is a multifunctional image sensor. In addition, carrier transportation performance can be improved by depositing the intermediate layer including TCO between the hybrid structure and the photoelectric conversion layer.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electrode structure, applied in an image sensor, comprising:
   a top electrode comprising a plurality of inner electrodes and an outer electrode electrically connected with the inner electrodes, wherein the inner electrodes are configured to filter a light by wavelength range and filter the light into a polarized light, each of the inner electrodes comprises:
      a metal structure having a first portion and a second portion extending along a first direction; and
      a dielectric structure extending along the first direction, wherein the dielectric structure are located between the first portion and the second portion of the metal structure, the first portion, the dielectric structure, and the second portion are arranged along a second direction different from the first direction;
   a bottom electrode located below the top electrode, wherein the top electrode and the bottom electrode are overlapped in a third direction perpendicular to the first direction and the second direction; and
   a photoelectric conversion layer (PCL) configured to convert the light into electric signals, wherein the outer electrode, the metal structure, and the dielectric structure are located above the photoelectric conversion layer,
   wherein the bottom electrode is located below the photoelectric conversion layer.

2. The electrode structure of claim 1, wherein the inner electrodes further comprise a plurality of intermediate layers, and wherein each intermediate layer is located between the corresponding metal structure and the photoelectric conversion layer and configured to smoothen a potential energy difference between the metal structure and the photoelectric conversion layer.

3. The electrode structure of claim 2, wherein the intermediate layers comprise transparent conductive oxide (TCO).

4. The electrode structure of claim 2, wherein the outer electrode is physically connected with the intermediate layers of the inner electrodes, and the outer electrode and the intermediate layers are located above a top surface of the photoelectric conversion layer.

5. The electrode structure of claim 4, wherein the outer electrode and the intermediate layers have the same material.

6. The electrode structure of claim 4, wherein the intermediate layers are located above a top surface of the photoelectric conversion layer facing the top electrode, and the metal structure and the dielectric structure of each of the inner electrodes are in contact with a top surface of the corresponding intermediate layer.

7. The electrode structure of claim 2, wherein the outer electrode is physically connected with the metal structures of the inner electrodes, and the outer electrode is space apart from a top surface of the photoelectric conversion layer facing the top electrode.

8. The electrode structure of claim 7, wherein each of the intermediate layers surround a lower portion of the metal structure and a lower portion of the dielectric structure, and each of the intermediate layers and the corresponding lower portion are embedded in the photoelectric conversion layer.

9. The electrode structure of claim 1, wherein a pitch of the inner electrodes is in a range of $0.5\lambda$ to $0.75\lambda$, wherein $\lambda$ corresponds to a peak or a valley of a light spectrum.

10. The electrode structure of claim 1, wherein each of the inner electrodes has a width along the second direction, and a duty cycle of the inner electrodes is in a range of 20% to 90%.

11. An image sensor, comprising:
a plurality of pixels, wherein each of the pixels comprises a plurality of sub-pixels, and each of the sub-pixels comprises an electrode structure, and wherein each of the electrode structures comprises:
  a top electrode comprising a plurality of inner electrodes and an outer electrode connected with the inner electrodes, wherein the inner electrodes are configured to filter a light by wavelength range and filter the light into a polarized light, each of the inner electrodes comprises:
    a metal structure having a first portion and a second portion extending along a first direction; and
    a dielectric structure extending along the first direction, wherein the dielectric structure is located between the first portion and the second portion of the metal structure, the first portion, the dielectric structure, and the second portion are arranged in a second direction different form the first direction;
  a bottom electrode located below the top electrode, wherein the top electrode and the bottom electrode are stacked along a third direction perpendicular to the first direction and the second direction; and
a photoelectric conversion layer configured to convert light into electric signals, wherein the photoelectric conversion layer is located between the top electrode and the bottom electrode;
wherein the inner electrodes comprise a plurality of intermediate layers configured to improve carrier transportation performance, wherein the intermediate layers are located between the corresponding metal structures and the photoelectric conversion layer.

12. The image sensor of claim 11, wherein a number of the sub-pixels is four, each of the inner electrodes in the sub-pixels has a tilted angle, and the tilted angles of the inner electrodes of adjacent two of the sub-pixels have an angle difference of 45 degrees.

13. The image sensor of claim 12, wherein the sub-pixels comprises a first sub-pixel, a second sub-pixel, a third sub-pixel, and a fourth sub-pixel, the first sub-pixel has a first tilted angle, the second sub-pixel has a second tilted angle, the third sub-pixel has a third tilted angle, the fourth sub-pixel has a fourth tilted angle, the first tilted angle is smaller than the second tilted angle, the third tilted angle, and the fourth tilted angle, and wherein the first tilted angle is 90 degrees, 120 degrees, or 150 degrees.

14. The image sensor of claim 11, wherein a number of the pixels is four, the pixels form a pixel array, and wherein the pixel array comprises a CYYM mosaic arrangement, and the pixel array comprises a cyan pixel, a magenta pixel, and two yellow pixels.

15. The image sensor of claim 11, wherein a number of the pixels is four, the pixels form a pixel array, and wherein the pixel array comprises a RGGB mosaic arrangement, and the pixel array comprises a red pixel, a blue pixel, and two green pixels.

16. The image sensor of claim 11, wherein a number of the pixels is four, the pixels form a pixel array, and wherein the pixel array comprises a CYGM mosaic arrangement, and the pixel array comprises a cyan pixel, a yellow pixel, a green pixel, and a magenta pixel.

17. The image sensor of claim 11, wherein a number of the pixels is four, the pixels form a pixel array, and wherein the pixel array comprises a RGBW mosaic arrangement, and the pixel array comprises a red pixel, a green pixel, a blue pixel, and a white pixel.

18. The image sensor of claim 11, wherein the image sensor comprises a n-channel device, the intermediate layers are located above a top surface of the photoelectric conversion layer facing the top electrode, and the metal structure and the dielectric structure of each of the inner electrodes are in contact with a surface of the corresponding intermediate layer facing away from the photoelectric conversion layer.

19. The image sensor of claim 11, wherein the image sensor comprises a p-channel device, each of the intermediate layers surround a lower portion of the metal structure and the dielectric structure, and the intermediate layer and the lower portion are embedded in the photoelectric conversion layer.

* * * * *